United States Patent
Xu et al.

(10) Patent No.: US 8,365,810 B2
(45) Date of Patent: Feb. 5, 2013

(54) ACTIVE HEAT SINK FOR USE WITH ELECTRONIC DEVICE

(75) Inventors: Shou-Biao Xu, Shenzhen (CN);
Shi-Wen Zhou, Shenzhen (CN);
Chun-Chi Chen, Taipei Hsien (TW)

(73) Assignees: Fu Zhun Precision Industry (Shen Zhen) Co., Ltd., Shenzhen (CN);
Foxconn Technology Co., Ltd., New Taipei (TW)

( * ) Notice: Subject to any disclaimer, the term of this patent is extended or adjusted under 35 U.S.C. 154(b) by 769 days.

(21) Appl. No.: 12/496,653

(22) Filed: Jul. 2, 2009

(65) Prior Publication Data

US 2010/0163213 A1  Jul. 1, 2010

(30) Foreign Application Priority Data

Dec. 25, 2008  (CN) .......................... 2008 1 0306535

(51) Int. Cl.
*F28D 15/02* (2006.01)
(52) U.S. Cl. ..................... 165/80.2; 165/86; 165/104.33
(58) Field of Classification Search ........ 165/80.2–80.4, 165/86, 87, 104.25, 104.26, 104.33, 104.34, 165/185; 361/695–697
See application file for complete search history.

(56) References Cited

U.S. PATENT DOCUMENTS

| | | | | |
|---|---|---|---|---|
| 3,882,335 A * | 5/1975 | Fries | ................................ | 310/61 |
| 5,388,958 A * | 2/1995 | Dinh | ................................ | 415/90 |
| 5,588,483 A * | 12/1996 | Ishida | .............................. | 165/86 |
| 5,629,573 A * | 5/1997 | Ponnappan et al. | ............. | 310/64 |
| 6,186,755 B1 * | 2/2001 | Haga | ............................. | 418/55.1 |
| 6,199,625 B1 * | 3/2001 | Guerrero | ....................... | 165/80.3 |
| 6,876,550 B2 * | 4/2005 | Sri-Jayantha et al. | ........ | 361/699 |
| 7,273,091 B2 * | 9/2007 | Bahl et al. | ....................... | 165/121 |
| 7,481,263 B2 * | 1/2009 | Breier et al. | .................. | 165/80.4 |
| 7,484,553 B2 * | 2/2009 | Lai et al. | ................... | 165/104.26 |
| 7,896,611 B2 * | 3/2011 | Khanna et al. | ................ | 415/177 |
| 2004/0196632 A1 * | 10/2004 | Chen et al. | .................... | 361/697 |
| 2006/0151153 A1 * | 7/2006 | Chen | ......................... | 165/104.26 |
| 2007/0039726 A1 * | 2/2007 | Lee | ................................ | 165/182 |
| 2008/0006394 A1 * | 1/2008 | Gupta et al. | .............. | 165/104.21 |
| 2008/0225488 A1 * | 9/2008 | Khanna et al. | ................. | 361/701 |
| 2009/0120099 A1 * | 5/2009 | Brand et al. | ..................... | 60/785 |
| 2009/0301694 A1 * | 12/2009 | Zhou et al. | ............... | 165/104.33 |

FOREIGN PATENT DOCUMENTS

| | | |
|---|---|---|
| CN | 1472497 A | 2/2004 |
| JP | 59190017 A * | 10/1984 |
| JP | 01278822 A * | 11/1989 |
| TW | 388605 U | 4/2000 |

* cited by examiner

*Primary Examiner* — Teresa Walberg
(74) *Attorney, Agent, or Firm* — Altis Law Group, Inc.

(57) ABSTRACT

A heat sink includes a heat conducting base, a heat conducting shaft thermally connected to and rotating with respect to the base, and a plurality of fins. The shaft includes a heat absorbing section thermally connected to the base and a heat dissipating section connected with the heat absorbing section. The fins are disposed on the heat dissipating section of the shaft.

1 Claim, 3 Drawing Sheets

ACTIVE HEAT SINK FOR USE WITH ELECTRONIC DEVICE

BACKGROUND

1. Technical Field

The disclosure relates to heat dissipation devices for use with electronic device and, particularly, to an active heat sink with rotating heat-dissipating fins.

2. Description of Related Art

As integrated circuits and other heat-generating electronic devices are made smaller and designed to operate at increasingly higher processing speeds, they generate increasing amounts of unwanted heat during operation. Excessive heat generated during operation can harm heat-generating electronic device performance and reliability and can cause system failure. A thermal management such as heat sink has accordingly become an increasingly important element in the design of heat-generating electronic products.

Heat sinks are typically used to dissipate heat from the surface of heat-generating electronic components to a cooler environment, usually ambient air. A heat sink typically includes a thermally conductive base plate that interfaces directly with a heat-generating electronic device to be cooled and a set of fins extending from the base plate. The fins increase the surface area that is in direct contact with the air to thereby increase heat transfer efficiency.

Active heat sinks are heat sinks equipped with air driving devices (such as fans and blowers) for forcing airflow across surfaces of the fins and passages between the fins. The airflow further increases heat transfer from the fins to the surrounding air. However, the air driving device causes the active heat sinks to be bulky and makes the active heat sink having a complex structure.

What is needed, therefore, is an active heat sink which can overcome the described limitations.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
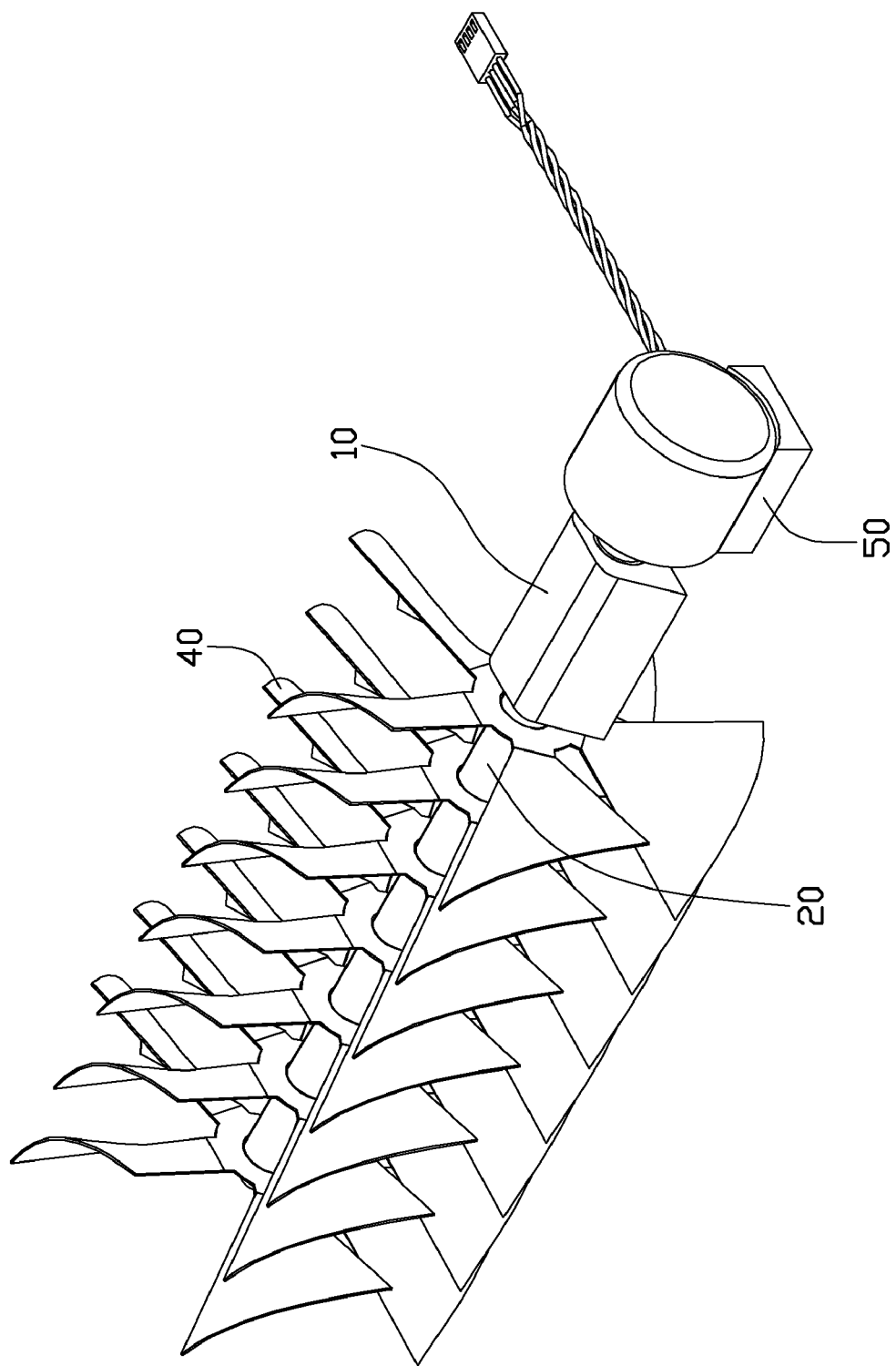
FIG. 1 is an assembled view of a heat sink in accordance with an embodiment of the disclosure.
Figure 2:
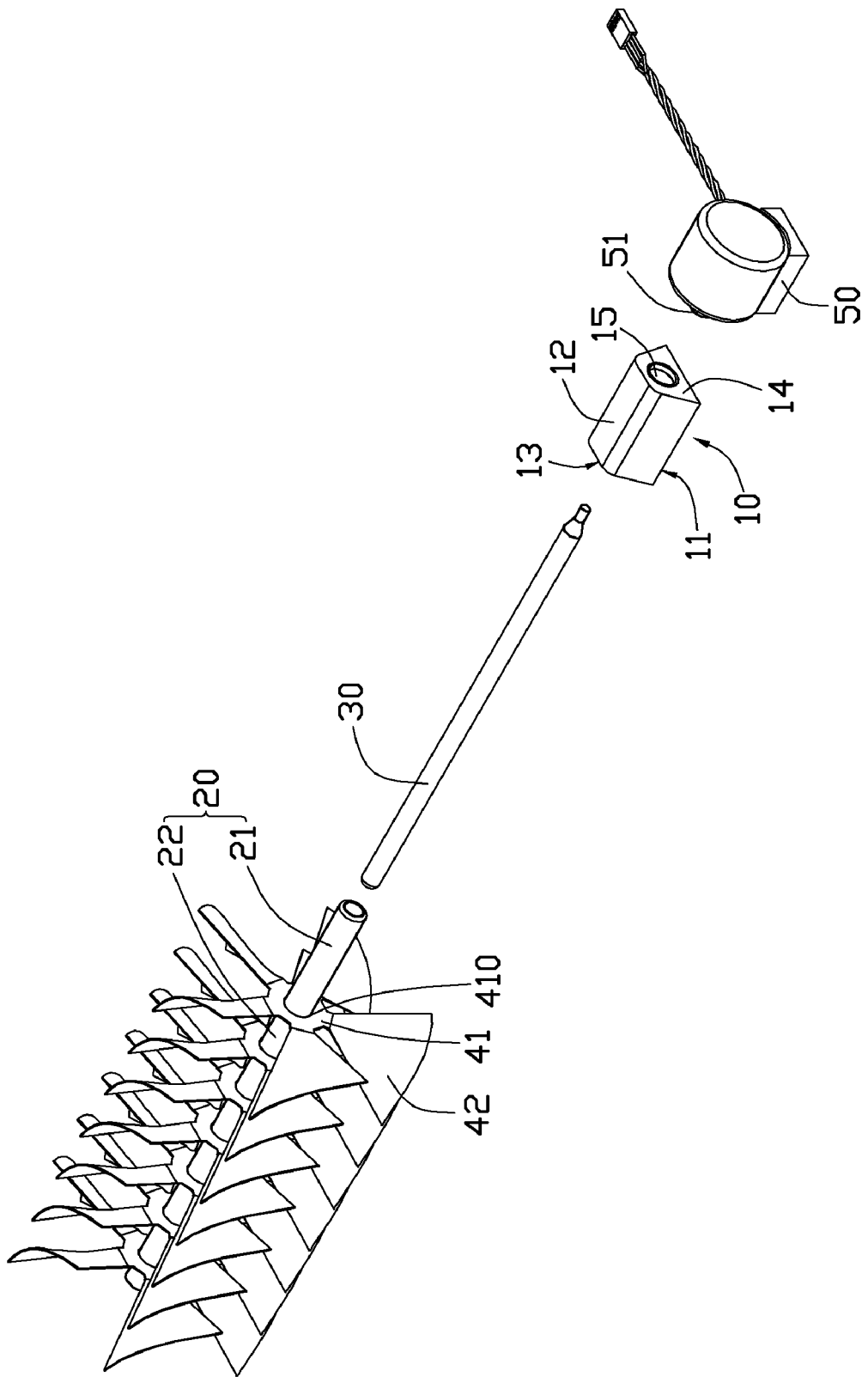
FIG. 2 is an isometric, exploded view of the heat sink of FIG. 1.
Figure 3:
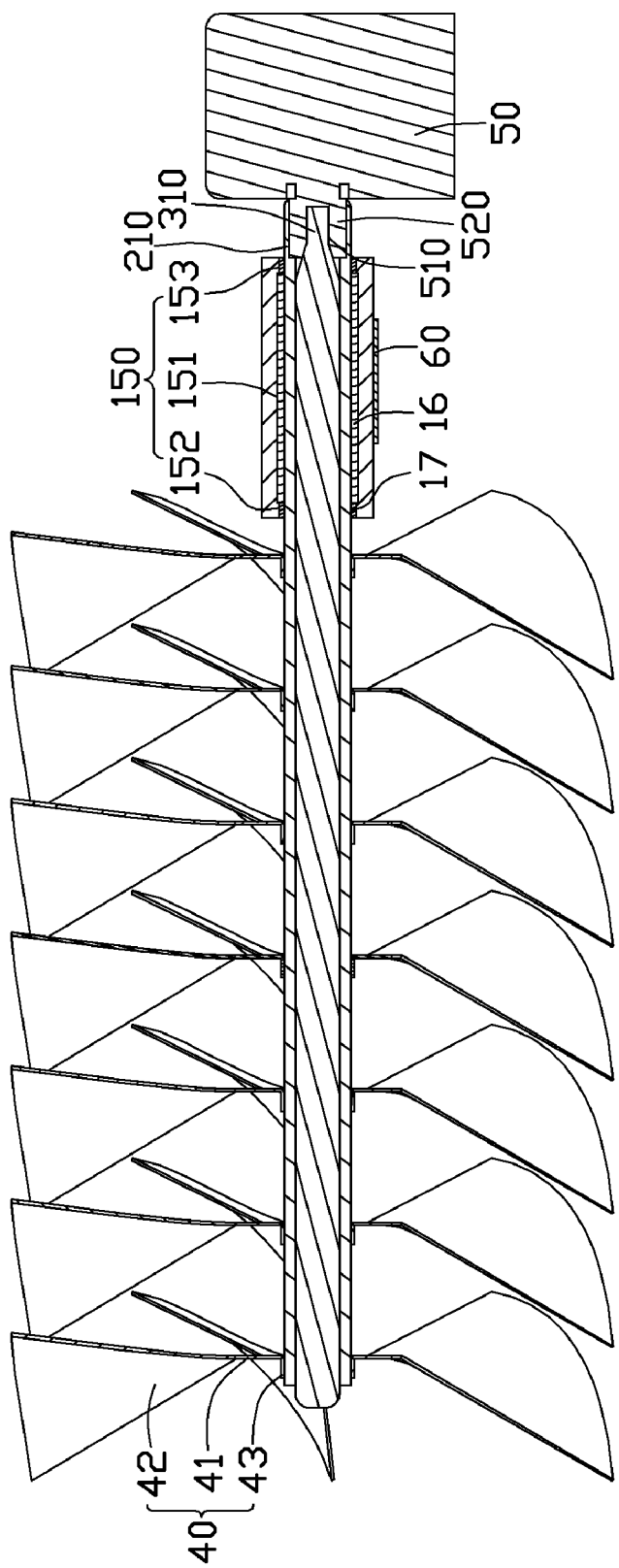
FIG. 3 is a cross-sectional view of the heat sink of FIG. 1

Referring to FIGS. 1-3, a heat sink includes a heat conducting base 10, a heat conducting sleeve 20 thermally engaged with the base 10, a heat pipe 30 inserted in the sleeve 20, a fin assembly disposed on the sleeve 20, and a motor 50 driving the sleeve 20 to rotate with respect to the base 10. The base 10, sleeve 20, heat pipe 30 and fin assembly each are made of a metal with high heat conductivity. In the present embodiment, the base 10, sleeve 20 and heat pipe 30 are made of copper, and the fin assembly is made of aluminum.

The base 10 is a trapezoidal block and includes a bottom surface 11 contacting with a heat-generating electronic element 60, a top surface 12, a first side surface 13 and a second side surface 14 opposite to the first side surface 13. An aperture 15 is defined in the base 10 and extends through the first and second side surfaces 13, 14. The base 10 includes a cylindrical inner wall 150 surrounding the aperture 15, and the inner wall 150 includes a middle section 151, a first end section 152 adjacent to the first side surface 13, a second end section 153 adjacent to the second side surface 14. The first and second end sections 152, 153 are connected to two opposite sides of the middle section 151. A bore diameter defined by each of the first and second end sections 152, 153 is less than that defined by the middle section 151. The middle section 151 is configured for engaging with the sleeve 20 and allowing a thermal interface material 16 which has an excellent lubricating capability filled therebetween, and the first and second end sections 152, 153 are configured for receiving two sealing rings 17, respectively, to seal two end openings of the base 10, whereby the thermal interface material 16 cannot be leaked out from the two end openings of the base 10.

The sleeve 20 includes a heat absorbing part 21 inserted into the aperture 15 of the base 10, and a heat dissipating part 22 connected to the heat absorbing part 21. The heat absorbing part 21 extends through the aperture 15 of the base 10 and a free end 210 of the heat absorbing part 21 is connected to the motor 50, whereby the heat absorbing part 21 is driven by the motor 50 to rotate with respect to the base 10. The thermal interface material 16 is filled between the middle section 151 of the inner wall 150 of the base 10 and an outer surface of the heat absorbing part 21 of the sleeve 20 to thereby provide an excellent lubricating effect and retain a thermal conductivity therebetween. In the present embodiment, the thermal interface material 16 is a heat conducting grease. The two sealing rings 17 are received in the first and second end sections 152, 153 of the inner wall 150, respectively, to seal the two end openings of the base 10, whereby the thermal interface material 16 cannot be leaked out from the two end openings of the base 10.

The heat pipe 30 is inserted into the sleeve 20, and an outer surface of the heat pipe 30 is welded onto an inner surface of the sleeve 20 by tin or other suitable solders. An evaporator of the heat pipe 30 connects with the heat absorbing part 21 of the sleeve 20, and a condenser of the heat pipe 30 connects with the heat dissipating part 22 of the sleeve 20. In such assembly, the heat pipe 30 and the sleeve 20 cooperatively construct a heat conducting shaft which can be driven by the motor 50 to rotate with respect to the base 10. The heat pipe 30 is a straight, circular tube and is coaxial with the sleeve 20. Outer diameter and length of the heat pipe 30 can be equal to or slightly less than inner diameter and length of the sleeve 20, respectively. Thus, heat exchange between the sleeve 20 and the heat pipe 30 can be greatly enhanced.

The motor 50 includes a rotor 51 engaging with the heat absorbing part 21 of the sleeve 20 and a free end 310 of the evaporator of the heat pipe 30. The rotor 51 includes an annular wall 520 which defines a recess 510. The wall 520 of the rotor 51 is inserted into the free end 210 of the heat absorbing part 21 of the sleeve 20; an outer surface of the wall 520 and an inner surface of the free end 210 of the heat absorbing part 21 are welded together by tin or other suitable solders. The free end 310 of the evaporator of the heat pipe 30 is received in the recess 510 of the rotor 51, and an outer surface of the free end 310 and an inner surface defining the recess 510 are welded together. According to this arrangement, the sleeve 20 with the heat pipe 30 inserted therein is secured to the rotor 51 of the motor 50, and whereby is driven by the motor 50 to rotate relative to the base 10.

The fin assembly includes a plurality of fins 40 equidistantly welded on an outer surface of the heat dissipating part 22 of the sleeve 20 by tin or other suitable solders. The fins 40 are parallel with each other. Each of the fins 40 includes a ring-like body 41 set around the outer surface of the heat dissipating part 22, a plurality of blades 42 (i.e., five blades 42) equidistantly extending outwardly from an outer circumference surface of the body 41, and a flange 43 extending vertically from an inner circumference surface of the body 41.

The body 41 is an annular sheet and defines a through hole 410 which has a diameter equal to or slightly larger than an outer diameter of the heat dissipating part 22, whereby the body 41 can be fittingly set around the outer surface of the heat dissipating part 22. Then the body 41 is welded onto the outer surface of the heat dissipating part 22 by tin or other suitable solders, so as to secure each of the fins 40 to the heat dissipating part 22 of the sleeve 20. Each of the blades 42 is a trapezium-like sheet which has a narrow end connected to the body 41 and a free wide end distant from the body 41. The blade 42 is bent to be an arc structure which has a concave surface facing away from the heat absorbing part 21 of the sleeve 20. The flange 43 is tightly engaged with the outer surface of the dissipating part 22 of the sleeve 20.

Alternatively, the sleeve 20 is not limited to be inserted into the aperture 15 of the base 10. For example, the top surface 12 of the base 10 defines an elongated semicircular groove, and the heat absorbing part 21 of the sleeve 20 is rotatablely received in the groove of the base 10. In addition, the motor 50 is not limited to be connected to the end 210 of the heat absorbing part 21 of the sleeve 20. For example, the motor 50 can be connected to a free end of the heat dissipating part 22 of the sleeve 20. It is to be understood that connection relationships among the sleeve 20, the base 10 and the motor 50 may be varied, so long as the sleeve 20 can be thermally and rotatablely connected with the base 10 when the sleeve 20 is rotated by the motor 50.

A structure of the heat pipe 30 is not limited to be a single straight, circular tube. For example, the heat pipe 30 can be replaced by a number of parallel elongated heat pipes extending along an axial direction of the sleeve 20 and welded on an inner surface of the sleeve 20 by tin. Alternatively, the sleeve 20 and the heat pipe 30 are integrated into a unitary heat pipe which has a thicker wall facilitating welding the fins 40 thereon.

In addition, the top surface 12 and side surfaces of the base 10 may protrude a number of fins to enhance heat dissipation efficiency of the heat sink.

In operation, the sleeve 20 with the heat pipe 30 is driven by the motor 50 to rotate relative to the base 10; the base 10 absorbs the heat generated by the heat-generating electronic element 60 and transfers the heat to the heat absorbing part 21 of the sleeve 20, the evaporator of the heat pipe 30, the condenser of the heat pipe 30, the heat dissipating part 22 of the sleeve 20 and the fins 40, in sequence. Particularly, the fins 40 rotate with the rotation of the sleeve 20; thus the fins 40 function as a number of impellers to force airflow across surfaces of the fins 40, passages between the fins 40, surfaces of the sleeve 20 and surfaces of the base 10. The airflow can increase heat transfer from the fins 40, the sleeve 20 and the base 10 to the surrounding air to thereby increase heat transfer efficiency.

It is to be understood, however, that even though numerous characteristics and advantages of the present embodiments have been set forth in the foregoing description, together with details of the apparatus and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

The invention claimed is:

1. A heat sink comprising:
a heat conducting base for contacting with a heat-generating electronic component, an aperture defined in the base, the base comprising a cylindrical inner wall surrounding the aperture;
a motor;
a heat conducting shaft, one end of the heat conducting shaft extending through the aperture of the base and mounted on the motor, the heat conducting shaft thermally connected to and rotating with respect to the base by a driving of the motor, the heat conducting shaft comprising a heat absorbing section thermally connected to the base and a heat dissipating section connected with the heat absorbing section; and
a plurality of fins disposed on an end of the heat dissipating section of the heat conducting shaft;
wherein the heat conducting shaft comprises a heat conducting sleeve and a heat pipe inserted in the sleeve, an outer surface of the heat pipe intimately contacts an inner surface of the sleeve, the sleeve comprises a heat absorbing part inserted in the aperture of the base and a heat dissipating part thermally contacting the fins, and a thermal interface material full in a gap between an outer surface of the heat absorbing part of the sleeve and the inner wall surrounding the aperture;
wherein an evaporator of the heat pipe combines with the heat absorbing part of the sleeve, and a condenser of the heat pipe combines with the heat dissipating part of the sleeve;
wherein the motor comprises a rotor engaging with a free end of the heat absorbing part of the sleeve and a free end of the evaporator of the heat pipe; and
wherein the rotor comprises an annular wall defining a recess, the wall is inserted into the free end of the heat absorbing part of the sleeve, and the recess of the rotor receives the free end of the evaporator of the heat pipe.

* * * * *